United States Patent [19]

Nussbaumer

[11] 4,093,994
[45] June 6, 1978

[54] FAST DISCRETE TRANSFORM GENERATOR AND DIGITAL FILTER USING SAME

[75] Inventor: Henri J. Nussbaumer, LaGaude, France

[73] Assignee: International Business Machines Corporation, Armonk, N.Y.

[21] Appl. No.: 779,212

[22] Filed: Mar. 18, 1977

[30] Foreign Application Priority Data

May 21, 1976 France .................................. 76 16129

[51] Int. Cl.² .......................................... G06F 15/34
[52] U.S. Cl. .................................. 364/726; 364/724; 364/725
[58] Field of Search .............. 235/156, 152; 324/77 B, 324/77 E; 328/167; 364/726, 725, 724

[56] References Cited

U.S. PATENT DOCUMENTS

| 3,679,882 | 7/1972 | McAuliffe | 235/156 |
| 3,900,721 | 8/1975 | Speiser et al. | 235/156 |
| 3,920,974 | 11/1975 | Means | 235/152 |

OTHER PUBLICATIONS

C. M. Rader "Discrete Convolutions via Mersenne Transforms," *IEEE Trans. on Computers,* vol. C-21, No. 12, Dec. 1972, pp. 1269–1273.

*Primary Examiner*—David H. Malzahn
*Attorney, Agent, or Firm*—Edward H. Duffield

[57] ABSTRACT

Digital filtering of digitally represented samples of an output analog signal may be greatly simplified when the required processing is done in a transformed domain instead of in the object domain. Such a transform is performed by converting blocks of samples $$a_n ]_{n=0}^{N-1}$$

into blocks of signals $$A_K ]_{K=0}^{N-1}$$

and vice versa where $$A_K = \sum_{n=0}^{N-1} a_n W^{nK}.$$

It will be obvious that the filtering operation can be performed efficiently when the computing power required for the transforms is not too great or expensive. It has been shown that whenever the number of samples N is the square of an integer M, any Fourier transform with $$W = e^{\frac{2\pi j}{N}}$$

may be performed using a bank of very simple filters. However, the technique is not as efficient in reducing the number of required computing operations as is the Fast Fourier transform decomposition.

the present invention proposes a design using a bank of simple filters to adapt the above method to the computation of transform operations performed in a ring (e.g., Mersenne or Fermat transforms). The bank of filters avoids most of the drawbacks of the prior method and enables the use of multiplexing techniques to reduce the processing structure required for the operation.

5 Claims, 11 Drawing Figures

FIG. 8

| INPUT | $a_n$ | $a_{n+N}$ | $a_{n+2N}$ |
|---|---|---|---|
| SW 54 | 1 1 1 1 0 0 0 0 0 0 0 0 0 0 0 0 | 1 1 1 1 0 0 0 0 0 0 0 0 0 0 0 0 | 1 1 1 1 0 0 0 0 |
| SW 55 | 1 1 1 0 0 0 0 0 0 0 0 0 0 0 0 2 | 1 1 1 0 0 0 0 0 0 0 0 0 0 0 0 2 | 1 1 1 0 0 0 0 0 |
| SW 56 | 1 1 0 0 0 0 0 0 0 0 0 0 0 0 2 2 | 1 1 0 0 0 0 0 0 0 0 0 0 0 0 2 2 | 1 1 0 0 0 0 0 0 |
| SW 57 | 1 0 0 0 0 0 0 0 0 0 0 0 0 2 2 2 | 1 0 0 0 0 0 0 0 0 0 0 0 0 2 2 2 | 1 0 0 0 0 0 0 0 |
| OUTPUT | $A_K^1$ | | $A_K^2$ |

FAST DISCRETE TRANSFORM GENERATOR AND DIGITAL FILTER USING SAME

Digital filtering of sampled signals may be greatly simplified if the corresponding operations, instead of being performed in the sample object domain, are performed in a transformed domain.

In effect, it is known that determining the $n^{th}$ sample $y_n$ of a filtered signal from an original signal $a_n$ requires a large number of operations to be carried out when direct methods are used, since:

$$y_n = \sum_{i=0}^{p} h_i \cdot a_{(n-i)} \quad (1)$$

where $h_i$ for $i = 0, 1 \ldots p$ is the coefficient defined from the characteristics of the desired filter and $a_n$ is the $n^{th}$ sample applied to the filter input.

Operation (1) is called a "convolution" operation.

Various solutions are known in the prior art for minimizing the computing power required for carrying out this convolution operation. For example, it has been proposed to use mathematical operators for separately transposing the coefficients and the input samples from the original domain (called "object domain") into a so-called transformed domain, to combine them appropriately in said transformed domain, then to carry out the reverse transformation to come back to the object domain thereby developing the series of samples $y_n$.

A judicious choice of the transform to be used can lead to a simplification of the operations to be carried out in the transformed domain. This is particularly the case when transforms of the so-called "Fourier" family are used (e.g., the so-called Fourier transform itself, the Mersenne or the Fermat transform). But, the corresponding economy of computing power resulting for the filter depends largely on the simplicity of the operations involved in carrying out the direct and inverse transforms. More specifically, it depends on the complexity of the means to be used for this purpose and on their performance.

Several processes are known for carrying out such transforms. One process is disclosed by L. I. Bluestein and is described in NEREM Record Volume 10, pages 218-219, November 1968, published by the Boston Section of Electrical and Electronic Engineers. The device described in that article and provided for carrying out the so-called Fourier transform itself involves some inaccuracies at the level of each of its branches. A decrease in the magnitude of these inaccuracies requires an improvement in the definition of the words to be processed and, therefore, an increase in the number of denominational orders in the words. Also, the operation cycle leads to a waste in the device processing power.

The principal object of this invention is to provide a device for carrying out transforms of the Fourier family, which transforms do not introduce any additional noise and which maximize the performance of the circuits in use.

This and other objects, advantages and features of the present invention will become more readily apparent from the following specification taken in conjunction with the appended drawings.

Figure 7:
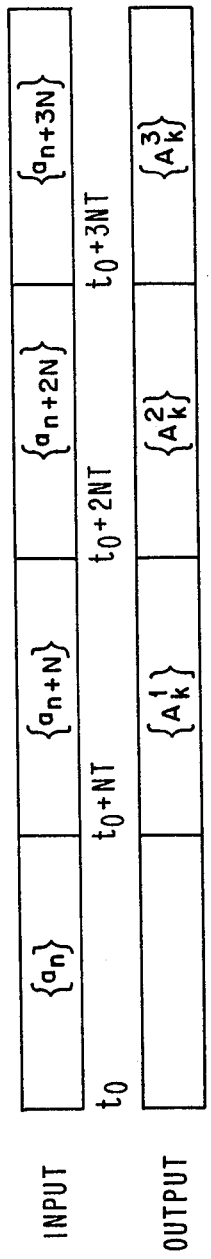
Figure 6:
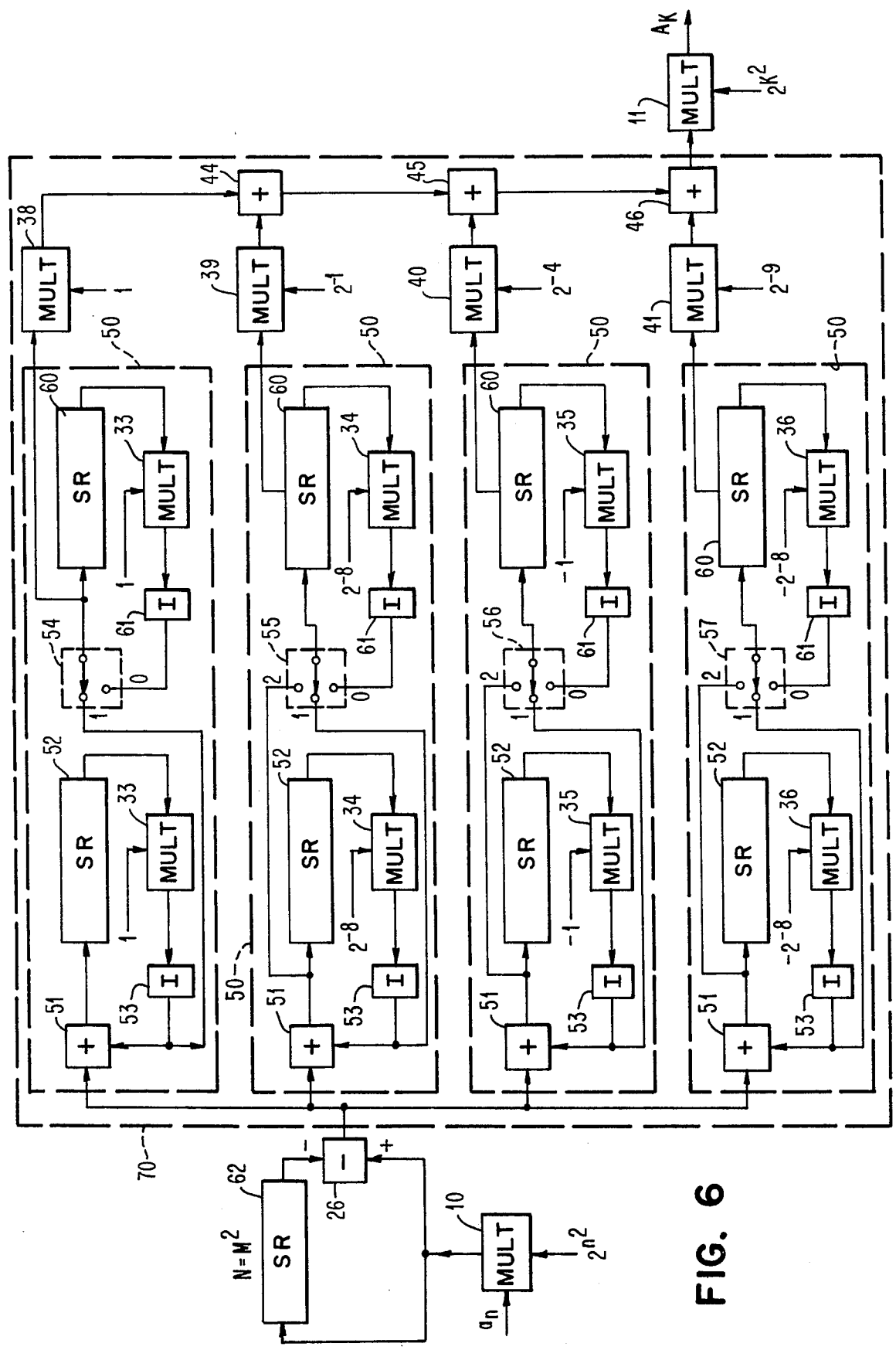

FIGS. 6, 7, and 8 show a different embodiment of this invention and its operating diagrams.

Figure 9:
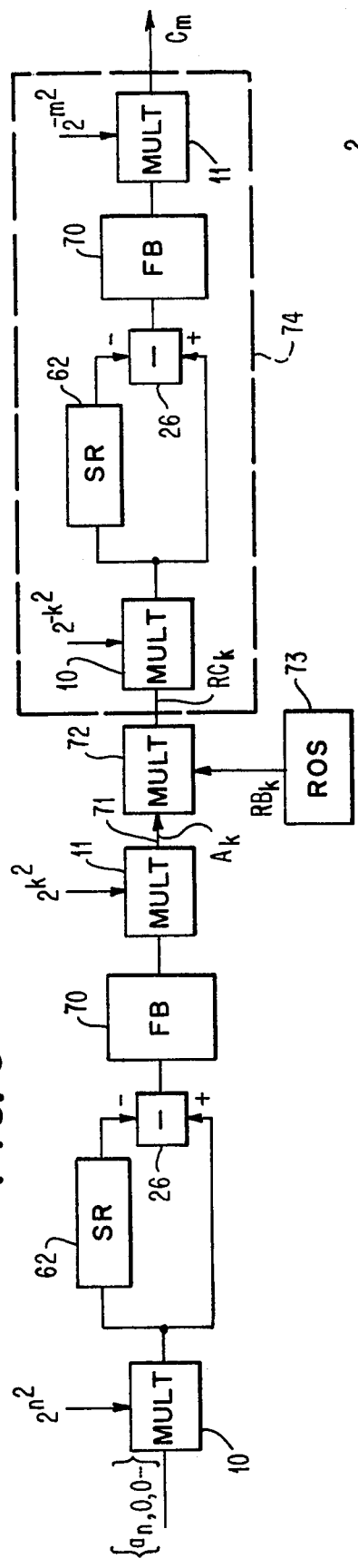
Figure 10:
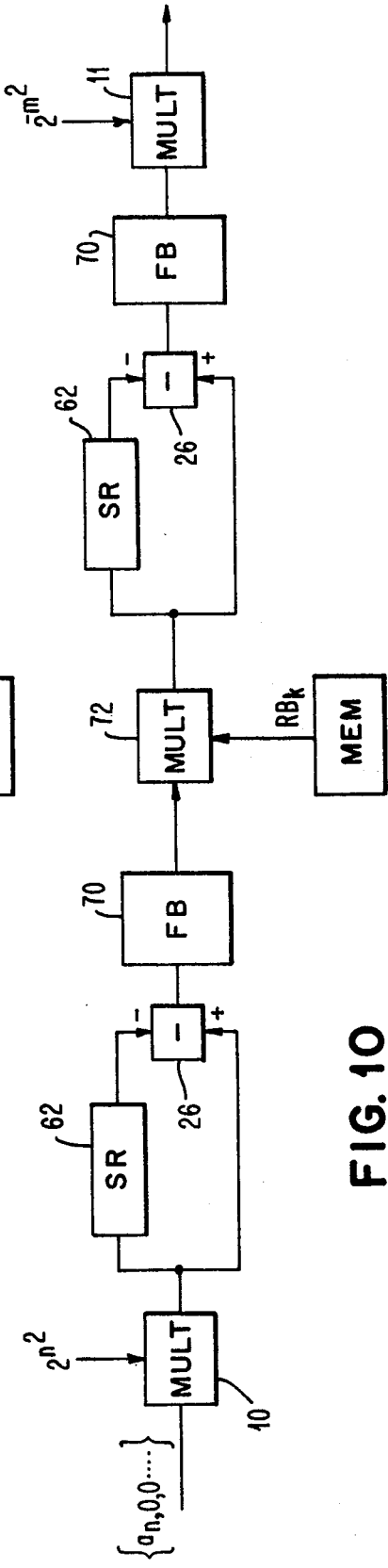

FIGS. 9 and 10 show digital filters utilizing the transform generators of this invention.

Figure 11:
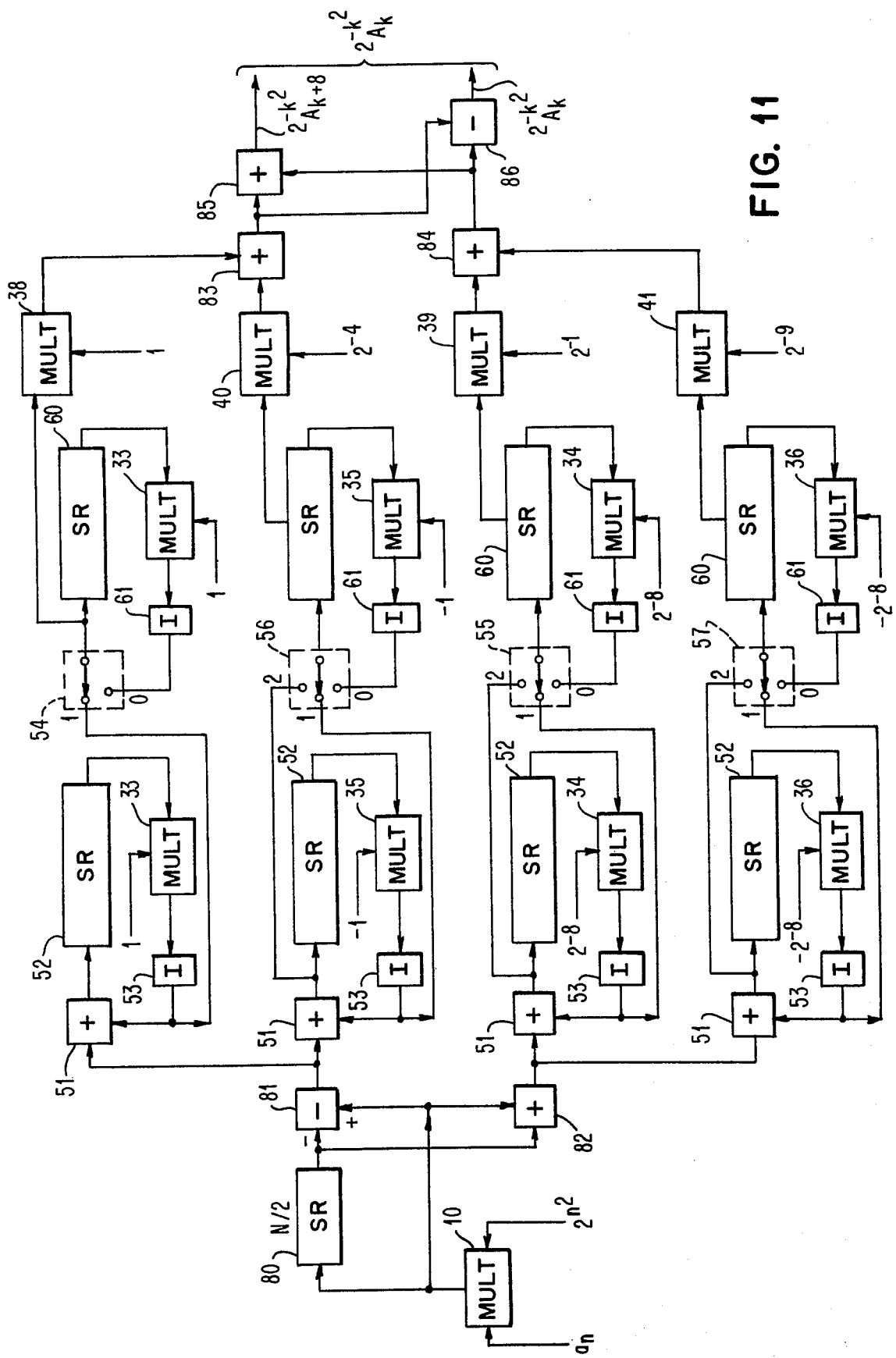

FIG. 11 illustrates still another embodiment of this invention.

The transforms of the Fourier family allow the conversion of N samples $[a_n]$ of a series of samples into N terms $A_K$ according to the following relation:

$$A_K = \sum_{n=0}^{N-1} a_n \cdot W^{nK} \quad (2)$$

with $n, K = 0, 1 \ldots, N-1$ and $W^N = 1$.

The convolution theorem applies to these transforms.

The Fourier transform itself is defined by the assumption that in the above equation (2):

$$W = e^{-2j\frac{\pi}{N}}$$

where $e$ is the base of natural logarithms and $j$ is the square root of minus one.

As to the other transforms of the Fourier transform family which are considered to be within the scope of this invention, their terms are defined modulo $p$, where $p$ is an odd integer, for example, $p = 2^q \pm 1$, W is a multiple of 2, and the exponents are defined modulo $q$ or $2q$ for the Mersenne and Fermat transforms, respectively.

Expression (2) can also be written as follows:

$$A_K = W^{-\frac{K^2}{2}} \sum_{n=0}^{N-1} a_n \cdot W^{\frac{n^2}{2}} \cdot W^{-\frac{(K-n)^2}{2}}$$

By defining $b_n$ such that $$b_n = a_n \cdot W^{n^2/2},$$

we have $$A_K = W^{-\frac{K^2}{2}} \sum_{n=0}^{N-1} b_n \cdot W^{-\frac{(K-n)^2}{2}} \quad (3)$$

Expression (3) shows that it is possible to determine the terms of the series $A_K$ by using a digital filter, the coefficients of which are:

$$1, W^{-1/2}, W^{-2} \ldots W^{-(N-2)^2/2} \text{ and } W^{-(N-1)^2/2}$$

placed between two multipliers, one for multiplying the terms of $a_n$ by $W^{n^2/2}$ and the second one for multiplying the terms issuing from the filter by $W^{K^2/2}$.

Figure 1:
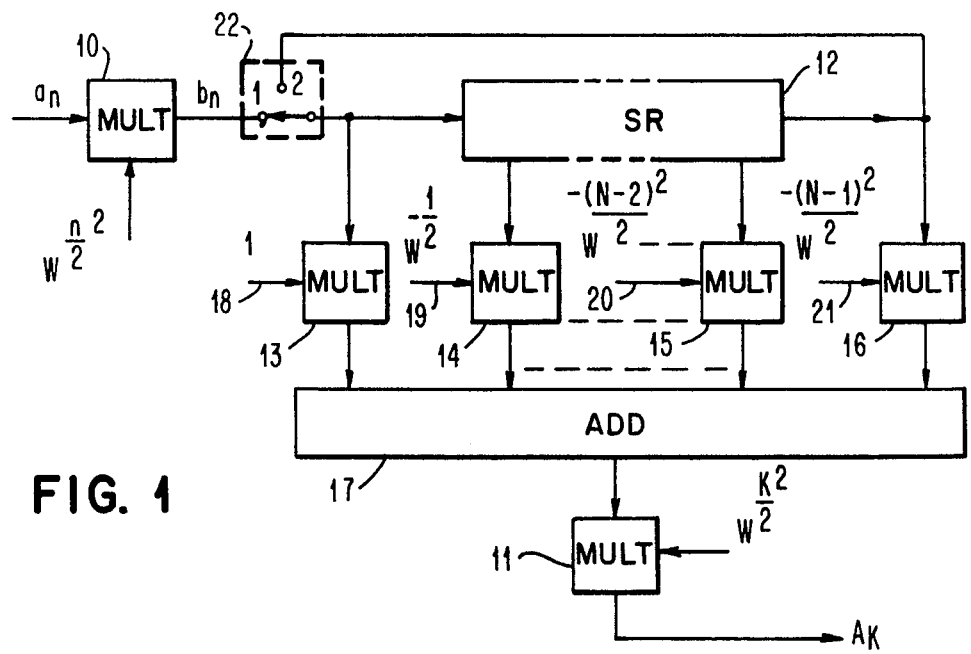
FIG. 1 is a schematic diagram of a basic device for generating discrete transforms by filtering.

Therefore, it is possible to design a transform generator as shown in the diagram of FIG. 1. There is an upstream multiplier 10 and a downstream multiplier 11 and between them there is a conventional transversal filter including a shift register 12, multipliers 13 to 16 and an adder 17. The filter coefficients for the multipliers 13 through 16 are set equal to the series:

$1, W^{-1/2}, \ldots W^{-(N-1)^2/2}$ and are entered on multiplier inputs 18–21, respectively. It should be noted that, due to the fact that $W^N \equiv 1$, these coefficients are symmetrical, i.e., $$W^{-(N-n)^2/2} = W^{-n^2/2}$$

Figure 2:
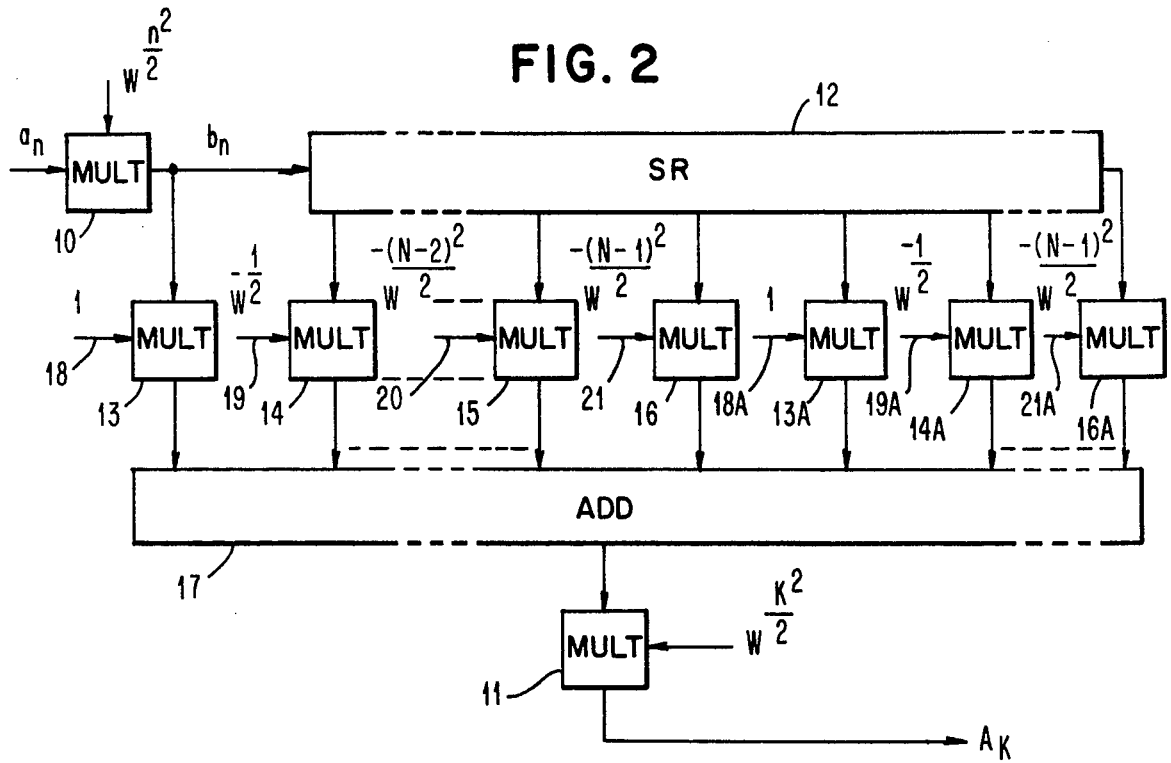
FIG. 2 is a schematic diagram of a second form of a basic device for generating discrete transforms.

A two position switch 22 is added to complete the device. This switch is initially in position 1, so that shift register 12 receives terms $b_0, b_1 \ldots b_{N-1}$ from multiplier 10. Adder 17 is held inoperative and does not provide any output. Next, i.e., at the $N^{th}$ instant, switch 22 is put into position 2, which allows the data in shift register 12 to be looped upon itself and the filter feeds multiplier 11 whose output provides the terms of transforms $A_K$ after N recirculations in shift register 12. If it is desirable to eliminate the recirculation in shift register 12, this can be done by doubling the length of shift register 12 and doubling the number of filter multipliers 13 through 16. This modification is shown in FIG. 2 where the suffix A is applied to the reference numerals of the added multipliers 13A–16A. The $z$ transfer function of the filter obtained in this way is:

$$H(z) = \sum_{K=0}^{2N-1} W^{-\frac{K^2}{2}} \cdot z^{-K} \quad (4)$$

At a first glance, it is possible to have doubts about the practicality of the device just described. In effect, for the simplifying of the filtering of a signal defined by its samples $a_n$, it recommends the performance of the operations in a transposed domain. The converting of the samples from the object domain to the transposed domain is proposed to be done by the use of conventional filters. Although this remark is exact, it does not wholly eliminate the interest in the use of the filter as a transform generator in some applications.

In particular, in the use when one has to process transforms in which the operations are performed modulo $p$. Expression (4) becomes:

$$H(z) = \left(\left(\sum_{K=0}^{2N-1} W^{-\frac{K^2}{2}} z^{-K}\right)\right)_p \quad (5)$$

where the double parentheses symbol $((\text{--}))_p$ means that the operations are performed modulo $p$.

When $N = M^2$, if we assume the relationship that $$K = u + vM$$

with $K = 0, 1 \ldots 2M^2 - 1$
$u = 0, 1 \ldots M - 1$, and
$v = 0, 1 \ldots, \ldots 2M - 1$, then expression (5) becomes:

$$H(z) = \left(\left(\sum_{K=0}^{2N-1} W^{-\frac{1}{2}(u+vM)^2} \cdot z^{-(u+vM)}\right)\right)_p$$

$$H(z) = \left(\left(\sum_{u=0}^{M-1} \sum_{v=0}^{2M-1} W^{-\frac{u^2}{2}} W^{-Muv} W^{-\frac{v^2 M^2}{2}} z^{-u} z^{-Mv}\right)\right)_p$$

Since $W^N$ is congruent to 1, then $$W^{-\frac{M^2 v^2}{2}} = W^{-\frac{Nv^2}{2}} = (-1)^{v^2} = (-1)^v$$

$$H(z) = \left(\left(\sum_{u=0}^{M-1} \sum_{v=0}^{2M-1} (-1)^v \cdot W^{-\frac{u^2}{2}} W^{-Muv} z^{-u} z^{-Mv}\right)\right)_p$$

But as $$\sum_{v=0}^{2M-1} (-1)^v \cdot W^{-Muv} \cdot z^{-Mv}$$

shows a geometrical progression and is, therefore, equal to:

$$\frac{1 - W^{-2uM^2} z^{-2M^2}}{1 + W^{-uM} z^{-M}} = \frac{1 - z^{-2M^2}}{1 + W^{-uM} z^{-M}},$$

$H(z)$ can be written as follows:

$$H(z) = \left(\left(\sum_{u=0}^{M-1} (1 - z^{-2M^2}) \frac{z^{-u}}{1 + W^{-uM} z^{-M}} W^{-\frac{u^2}{2}}\right)\right)_p$$

$$H(z) = \left(\left((1 - z^{2M^2}) \sum_{u=0}^{M-1} \frac{z^{-u}}{1 + W^{-uM} z^{-M}} \cdot W^{-\frac{u^2}{2}}\right)\right)_p$$

Figure 3:
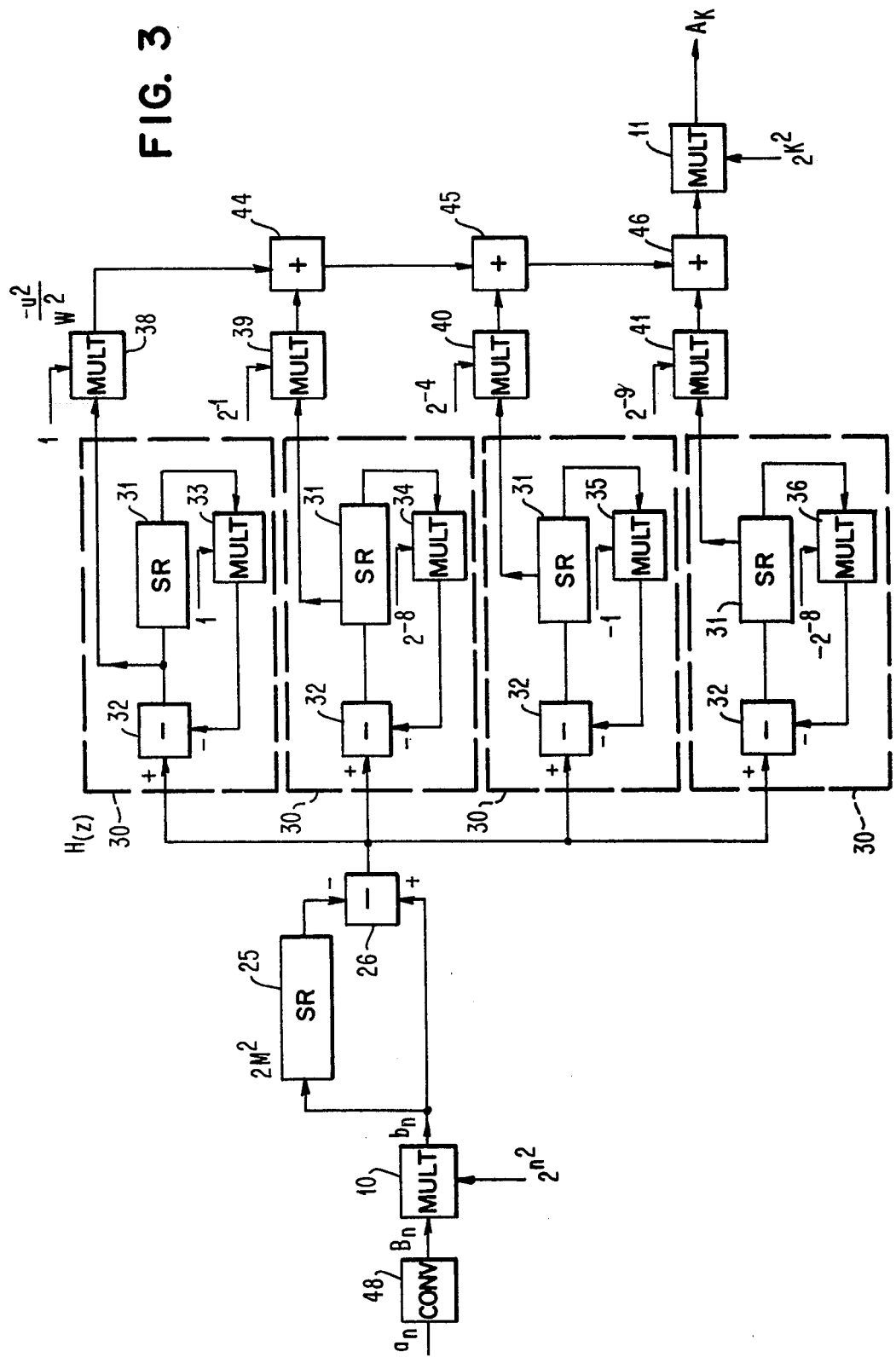
FIG. 3 shows a first embodiment of the invention.

Now, the transversal filter of FIG. 2 may be replaced by a bank of M extremely simple filters such as the one shown in FIG. 3 and described for the example of a 16-term Fermat transform where $p = 2^{16} + 1$ and $W = 4$.

Multiplier 10 receives samples $a_n$ sequentially, multiplies them respectively, by $2^{n^2}$ and delivers terms $b_n$ at its output. These terms $b_n$ are introduced into the input of a shift register 25 which is $2M^2 = 2N$ terms long and they are also fed into the additive input of a subtractor 26. The output of shift register 25 is connected to the subtractive input of subtractor 26 whose output is connected to the input of a bank of M filters, each branch of which includes a recursive filter having a transfer function of:

$$H(z) = \frac{z^{-u}}{1 + W^{-uM} z^{-M}}$$

followed by a multiplier multiplying by $W^{-u^2/2}$. Each recursive filter includes a subtractor, an M word long shift register and a multiplier to multiply the filter output by the term $W^{-uM}$.

The device shown in FIG. 3 is provided for carrying out a so-called Fermat transform with sixteen points ($N = 16$), therefore, $M = 4$, if $W = 4$ and $q = 16$. The output terms $A_K$ are $$A_K = \left(\left(\sum_{n=0}^{15} a_n \cdot 2^{2nk}\right)\right)_{2^{16}+1}$$

Therefore, shift register 25 has a length of 32 words, i.e., two blocks of 16 words. The filter bank comprises four branches and the recursive filter 30 of each of these branches includes a shift register 31 of a length corresponding to four words, a subtractor 32 receiving the output of subtractor 26 at its additive input and a multiplier 33, 34, 35, or 36. Multiplier 33 multiplies by 1, multiplier 34 multiplies by $2^{-8}$; multiplier 35 by $-1$ and multiplier 36 by $-2^{-8}$. The outputs of the filters 30 are taken from the input, first stage output, second stage output and third stage output of the shift registers 31, respectively, and the outputs are multiplied by the terms $W^{-u^2/2}$ in multipliers 38 through 41 which multiply by the values 1, $2^{-1}$, $2^{-4}$, and $2^{-9}$, respectively. The outputs of the multipliers 38 through 41 are added together in adders 44, 45, and 46. The sum of these outputs is the output of adder 46 which feeds the input of multiplier 11 where it is multiplied by a factor $2^{K^2}$ and the output of which provides the $A_K$ terms of the transform.

Therefore, it can be seen that the only multiplications needed for the transform operation are multiplications by a fixed coefficient equal to a power of two. It is also possible to show that, in the same way, a similar result can be obtained when a pseudo Mersenne transform is performed. The transform is defined by the relation:

$$A_K = \left(\left(\sum_{n=0}^{N-1} a_n \cdot W^{nk}\right)\right)_p$$

where $$p = (2^q - 1)/f$$

$q$ and $2^q - 1$ are non-prime numbers; $f$ is an integral factor of $2^q - 1$ and $W$ is a power of 2. Such a transform can be calculated modulo $2^q - 1$ as a conventional Mersenne transform with, in addition, a last operation:

$$\text{modulo } \frac{2^q - 1}{f} = p$$

For the purposes of this invention, one could choose the parameters:

$$N = 7^2 = 49, \text{ and } p = \frac{2^{49} - 1}{127}$$

therefore $$A_K = \left(\left(\sum_{n=0}^{48} a_n \cdot 2^{nK}\right)\right)_p$$

In this case, all the calculations could be performed modulo $2^{49} - 1$ and it would be sufficient to complete them by carrying out a last correcting operation modulo $(2^{49} - 1)/127$.

But in an arithmetic operation carried out modulo a Mersenne number, the multiplication by $2^d$ corresponds to a simple permutation by $d$ of the bits of the word to be multiplied. Obviously this permutation costs very little since it can be provided by circuit connections when the device is initially wired. Unfortunately, this is not quite the case for an arithmetic operation modulo a Fermat number. In this case, a multiplication by $2^d$ involves a shift, a bit inversion and two additions. However, it is possible to simplify the operations in a Fermat system by carrying out a code conversion of the words to be processed. If the binary words up to a limit of $2^\alpha$ to be processed are referenced "$a$", the conversion is carried out in a converter 48, FIG. 3, where the output words B are the $2^\alpha$ complement of $a$ except when $a=0$, in which case B is equal to the weight of the bit of the highest order of "$a$".

Then, it can be shown that the multiplication of B by $2^d$ corresponds to a rotation of $d$ binary denominations toward higher orders with an inversion of the bits rotated through the highest order to the lower orders except when $a=0$ in which case the inversion should be inhibited.

However, it should be noted that in the code corresponding to B, the highest number which can be represented is equal to $2^\alpha - 1$, when "$a$" goes up to $2^\alpha$. Therefore, the modified numbers (B) will be represented by using $\alpha$ bits plus a so-called flag bit which, when equal to one, with all the other bits being at zero, indicates that $a=0$.

The following table gives the correspondance between $a$ and B where $\alpha$ is taken equal to 4.

| a (decimal) | B (decimal) | $2^0$ | B (binary) $2^1$ | $2^2$ | $2^3$ | flag |
|---|---|---|---|---|---|---|
| 0 | 16 | 0 | 0 | 0 | 0 | 1 |
| 1 | 15 | 1 | 1 | 1 | 1 | 0 |
| 2 | 14 | 0 | 1 | 1 | 1 | 0 |
| 3 | 13 | 1 | 0 | 1 | 1 | 0 |
| 4 | 12 | 0 | 0 | 1 | 1 | 0 |
| 5 | 11 | 1 | 1 | 0 | 1 | 0 |
| 6 | 10 | 0 | 1 | 0 | 1 | 0 |
| 7 | 9 | 1 | 0 | 0 | 1 | 0 |
| 8 | 8 | 0 | 0 | 0 | 1 | 0 |
| 9 | 7 | 1 | 1 | 1 | 0 | 0 |
| 10 | 6 | 0 | 1 | 1 | 0 | 0 |
| 11 | 5 | 1 | 0 | 1 | 0 | 0 |
| 12 | 4 | 0 | 0 | 1 | 0 | 0 |
| 13 | 3 | 1 | 1 | 0 | 0 | 0 |
| 14 | 2 | 0 | 1 | 0 | 0 | 0 |
| 15 | 1 | 1 | 0 | 0 | 0 | 0 |
| 16 | 0 | 0 | 0 | 0 | 0 | 0 |

Figure 4:
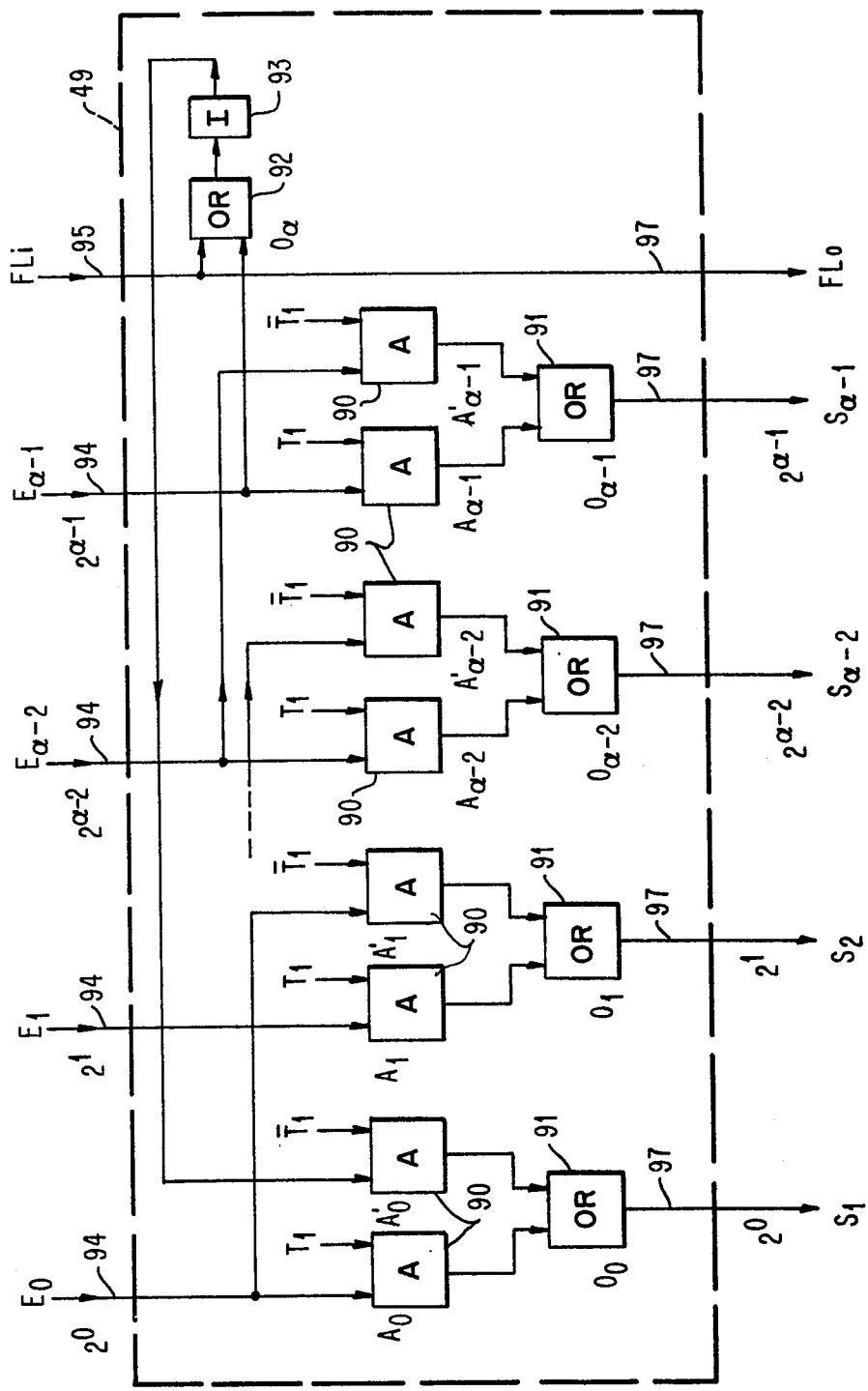
FIG. 4 is a diagram of a circuit for this invention.

Due to this word code conversion, the processing operation for a Fermat transform becomes simpler and the multiplication by $2^d$ can be carried out by using the multiplying device 49 of FIG. 4 instead of the conventional multiplier 10 used with the other types of transforms. This device 49 includes $2\alpha$ AND logic gates 90 referenced $A_0, A_0', A_1, A_1' \ldots A_{\alpha-1}, A_{\alpha-1}'$; OR logic circuits 91 referenced $O_0, O_1, O_2 \ldots O_{\alpha-1}$, an OR logic circuit 92 and an inverting circuit 93. Each bit of the input word B is applied to one of the $E_1, E_2 \ldots E_{\alpha-1}$ inputs 94. The flag bit Fli is applied to input 95. $E_O$ input 94 is connected to the input of $A_O$ and $A_1'$ gates 90; $E_1$ input 94 is connected to the $A_1$ and $A_2'$ gates 90, etc., up to $E_{\alpha-1}$ input 94 which is connected to $A_{\alpha-1}$ gate 90 and to one of the inputs of OR circuit 92, the second input of which is connected to flat input 95. The outpus of the $A_0$ and $A_0'$ gates 90 are connected to the inputs of the $O_O$ OR circuit 91. The outputs of the $A_1$ and $A_1'$ gates 90 are connected to the inputs of the $O_1$ OR 91, etc. The output of OR 92 is connected to the input of an inverter 93, the output of which is fed back to the input of $A_0'$ gate 90. The outputs 97 of this multiplying by $2^d$ device are referenced $S_1, S_2 \ldots S_{\alpha-1}$, and Flo. When the input word is null, the $A_0, A_1, A_2 \ldots A_{\alpha-1}$ gates 90 are opened by setting $T_1 = 1$ and a flag equal to 1 is forced on input 95 and goes to flag output 97. In all the other cases, a bit zero is entered in input 95 and $T_1$ is set to 0, which involves a shift of all the bits of the input word by one position towards the higher weights (right) with a feedback of the bit of highest weight to the level of the lowest bit after the inversion has been performed.

Thus, if the above indicated code conversion for Fermat transforms is performed before introducing words [a] into the convolution generator, as in indicated in FIG. 3 by the position of the converter 48 in the input lead, the arithmetical operations to be carried out in said generator are simplified. In particular, the multiplication of the terms of $a_n$ by $2^2$ in multiplier 10 will correspond to $d$ permutations and shifts of the word $B_n$ as defined in the new code. This multiplication can be performed by using the device of FIG. 4.

Figure 5:
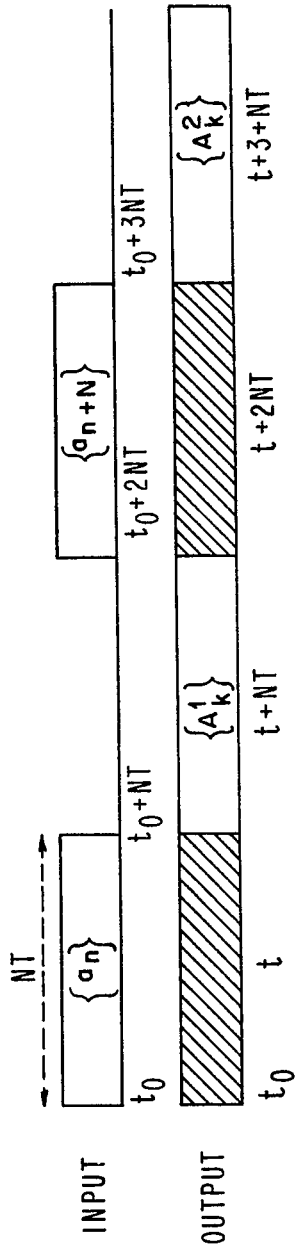
FIG. 5 is an operating diagram of the device shown in FIG. 3.

Therefore, the transform generator of FIG. 3 is particularly economical since it can be achieved with a minimum number of circuits. However, it operates rather slowly and, in effect, its timing goes in accordance with the diagram of FIG. 5. If a series of samples $a_n$ are applied to the device input at times $t_0$ and with an interval equal to T, the N samples of a first group $[a_n]$ are received during the interval NT. Computation of the corresponding transforms $[A_K{}^1]$ can only be started at time $t_0$ + NT and during all of the time required for determining $[A_K{}^1]$, no new samples can be received at the input. Application of the group of samples $[a_n + N]$ can be started only at time $t_0$ + 2NT and the second group of transforms $[A_K{}^2]$ starts appearing at $t_0$ + 3NT. The idle time accounts for 50 percent of the operating time of the device and this time is too important to be wasted.

The device shown on FIG. 6 eliminates the idle time and enables operating the system in accordance with the timing diagram of FIG. 7. For this purpose, the device 30 of FIG. 3, the transfer function of which is H'(z), is replaced by a device 50 having two loops, one loop carrying out a recursive filtering function and the second one performing recirculations, plus a two-position switch installed between these two elements. The recursive filter of each device 50 comprises the following items mounted in series: an adder 51; a shift register 52 having a storage length of M words; a multiplier 33, 34, 35, or 36 respectively, identical to the corresponding one for the device 30 shown on FIG. 3 and bearing the same reference numeral; and an inverter 53. The inverter output which is fed back to an input of the adder 51 is also connected to a terminal (1) of a three-position switch 54, 55, 56, and 57, respectively. Terminal 2 of switch 54 is unconnected while the corresponding terminal (2) of the other switches 55, 56, and 57 is connected to the output of the adder 51 of the associated recursive filter. Each recirculating device has an input which is connected to the moving contact of the associated one of the above indicated switches 54, 55, 56, and 57 and includes the following items mounted in series: a shift register 60 of a length corresponding to M words; a multiplier 33, 34, 35, or 36 corresponding to the similarly referenced one in the associated recursive filter of the same branch of the bank of filters and, therefore, multiplying by the same coefficient; and an inverter 61 whose output is connected to terminal (0) of the corresponding switch 54, 55, 56, or 57. And, finally, each of the branches of the filter bank comprises a multiplier 38, 39, 40, or 41 as in FIG. 3 and multiplying by a constant coefficient. The input of each of these last multipliers is connected to the shift register 60 of the associated recirculating device at a point similar to the one in the corresponding branch of filter 30 of FIG. 3. The remaining part of the filter bank includes adders 44, 45, and 46 and multiplier 11 identical to the corresponding ones of FIG. 3. To complete the description of the device shown on FIG. 6, it should be noted that input register 25 of FIG. 3 of a length corresponding to 2N on FIG. 3, is replaced by a register 62 of one half that length, i.e., a length N.

As shown by the diagram of FIG. 7, consecutive blocks of samples $[a_n]$, $(a_{n+N}]$, $[a_{n+2N}]$, etc., each block including N samples, follow one another without idle times at the input of multiplier 10 of the transform generator of FIG. 6. In the same way, output blocks $[A_K1]$, $[A_K2]$, etc., follow one another of the output of multiplier 11 with only one idle block time, on starting, between time $t_0$ and time $t_{0+NT}$. This time interval is used for the initial loading of shift register 62 with the first block of samples. The permutation timing of the common contact of the switches 54, 55, 56, and 57 which are placed between the filtering loop and the recirculating loop of a block 50 is shown in FIG. 8 for the case of the 16-point Fermat transform which has been taken as an example. The indication 0, 1, or 2 of the figure means that the common contact of the switch is in contact with the input line at the position to which this number is assigned in FIG. 6.

The Mersenne or Fermat transform generators which are described above, are particularly useful for constructing digital filters. For this use, one has to generate transforms $[B_K]$ and $[A_K]$ of two sequences $[b_n]$ and $[a_n]$ respectively representing the filter coefficients for the digital filter operation and the input signal samples. Then, the operation $A_K \cdot B_K = C_R$ is performed term-by-term, and the inverse of the transform is performed on terms $[C_K]$, which will provide terms $[c_m]$ corresponding to the circular convolution of terms $[a_n]$ and $[b_n]$. Relatively simple combinations lead from the circular convolution results to the filtered signal samples by using, for instance, the so-called "overlap-add" or "overlap-save" processes described in the 1969, McGraw-Hill book entitled "Digital Processing of Signals" by Gold and Rader, at page 205 (Library of Congress Catalog Card No. 69-13606), According to the above description, this invention allows the simplification of the design of a digital filter. But before describing such a filter, it should be noted that:

(1) The mathematical operations involved in carrying out the inverse transforms belong to the family considered above and since they are similar to the ones of the direct transform, the same type of means can be used for both types of operations, and (2) In a constant coefficient filter, the terms $B_K$ can be predetermined and stored which will save the need for a transform generator.

Therefore, the device generating the terms of the filtered output $[c_m]$ can be constructed in accordance with the diagram of FIG. 9. The input blocks are now comprised of a number of samples $a_n$ followed by an equal number of null terms (refer to the description of the "overlap" process) and are introduced into a direct transform generator similar to the one of FIG. 6 except that the filter bank comprised of filters 50, etc., is shown as a single block and is given reference numeral 70. The output of this generator provides a series of terms $A_K$ on its output 71 to a multiplier 72, the second input of which receives, from a storage 73, the terms $B_K$ of the series of filter coefficients with each filter coefficient multiplied by a constant coefficient R (this constant coefficient is involved in the inverse transform and its introduction at this point does not require any separate hardware). Terms $R \cdot C_K$ are introduced into an inverse transform generator referenced as 74 using a device similar to the one of FIG. 6, but whose input and output multiplying coefficients in multipliers 10 and 11 are $2^{-K^2}$ and $2^{-m^2}$, respectively. However, the multiplying operations are commutative in this case and since multipliers 11 of the first transform generator and multiplier 10 of the inverse transform generator perform complementary functions, they may be eliminated with only a change in the $B_K$ constants stored in storage 73. The resulting structure is shown in FIG. 10.

The use of the so-called "overlap" filtering processes involves an extension of the blocks of samples $[a_n]$ by adding a number of null terms. Practically, this amounts to doubling the length of the sample blocks submitted to the transform generators. But, in the device of this invention, the transforms are generated by using M recursive filters of the first order, each one including a multiplier for multiplication by a value $W^{-uM}$. During a time interval between an initial instant $t_1$ and time $$t_1 + (\frac{N}{2} - 1) T,$$

the non-null input samples are introduced into the recursive filters. Between (N/2) T and (N-1)T, the null samples are introduced and the processing is restricted to a recirculation of the computed terms with M/2 multiplications of those terms by the factor $W^{-uM}$. Thus, the output of the bank of filters at time NT is the output appearing on (N/2) T, but with each term multiplied by the factor $W^{-M2/2}$.

In the Fermat system, $W^N \equiv 1$, then $W^{N/2} \equiv -1$, therefore $W^{M2/2} \equiv -1$, and $W^{-u M2/2} \equiv (-1)^u$. This means that it is unnecessary to process the terms in the filter bank between time $t_1 + (N/2) T$ and $t_1 + NT$ provided that an appropriate sign correction is performed on the previously processed terms. Therefore, the direct transform generator to be used for the left half of the device of FIG. 10 can be embodied according to the scheme shown in FIG. 11. This device is quite similar to the one set out in FIG. 6, except for some elements, i.e., the filter bank 70 is divided in two sections, respectively, comprising the branches 50 of odd order and the branches 50 of even order in the original bank. The upper section (odd orders) in FIG. 11 is fed through multiplier 10, shift register 80 having a length of N/2 and a subtractor 81, while the lower section (odd orders) is fed through multiplier 10, shift register 80 and an adder 82. The outputs of both odd orders are added in an adder 83 and the outputs of the two even orders are added in an adder 84. The outputs of adders 83 and 84 are combined in an adder 85 while the output of adder 84 is subtracted from that of adder 83 in a subtractor 86. The output of subtractor 86 provides the output terms $2^{-K^2} \cdot A_K$, and the output of adder 85 provides $2^{-K^2} \cdot A_K + (N/2)$. Also, it is to be noted that the operating cycle of the switches is no longer equal to N as shown in FIG. 8, but to N/2.

When the "overlap-add" process is used, however, it should be noted that the inverse transform of the right half of FIG. 10 is to be carried out by using the device of FIG. 6.

While the invention has been particularly shown and described with reference to the preferred embodiment thereof, it will be understood by those skilled in the art that various changes in form and details may be made therein without departing from the spirit and scope of the invention.

What is claimed is:

1. An improved generator of the terms of discrete transforms of the so-called Fourier transform family, particularly useful in digital filters and operating to generate a series of blocks of transform terms $[A_K]_{K=0}^{N-1}$ from a series of blocks of N digital samples $[a_n]_{n=0}^{N-1}$, where N is a square of an integer ($N=M^2$), said generator being of the type having an upstream weighting means for providing weighted sample $a_n$ terms and a downstream weighting means for providing transformed terms $A_K$ and having a filter bank comprising M filters placed between said upstream and downstream weighting means, and having adding means for adding the filtered outputs of individual orders of said M filters in said filter bank wherein said improvement comprises:

(a) subtracting means connected to the inputs of each order in said bank of filters for subtracting, term-by-term, from each weighted $a_n$ term which is provided by said upstream weighting means, the said weighted $a_n$ term which preceded it by 2N positions and, (b) each of the orders of said filters of said bank includes, an input terminal and an output terminal, a recursive filtering means having an input and an output and having its input connected to said input terminal of its said order filter in said bank and a constant coefficient weighting means having an input and output and, having its input connected to the output of the corresponding recursive filtering means of said M filter bank and its output, being the said output terminal for said order of said filter, being connected to said adder means for adding the output of said order of said filter to the outputs of the other said orders of said filters in said bank, the combined output of which is connected to said downstream weighting means.

2. A generator of the terms of the discrete so-called Fermat transform of the Fourier transform family as set out in claim 1 and characterized in that it includes:

a converter connected to the input of said upstream weighting means for converting each of said samples $a_n$ into a term $B_n$ such that each B is the $2^a$ complement of the corresponding $a$ term except that when $a$ is equal to 0, then B equals 0; and a flag bit generator within said converter to generate a flag bit signal when the $a$ term being converted is equal to 0.

3. A generator as set out in claim 2 further characterized in that said upstream weighting means includes:

a first plurality of gates, one for each bit of the binary representation of a term B, connected to the output of said converter;

a second plurality of gates, one for each bit of said binary representation;

an OR circuit combining the outputs of each pair of gates of the same binary denomination;

connections from each bit representing input line to an input of the corresponding gate of said first plurality of gates and to those gates of said second plurality which are for a binary representation higher by $d$ denominations than the denomination represented by the input line;

a different OR circuit and an inverter circuit for each input line for which there is no corresponding output line $d$ denominations higher;

connections from the outputs of said inverter circuits to corresponding lower denomination gates of said second plurality of gates;

a flag circuit connected to an input of each of said different OR circuits; and a control circuit having an input to each gate of said first and said second plurality of gates to select one or the other of said pluralities.

4. An improved generator of the terms of discrete transforms of the so-called pseudo Mersenne type, particularly useful in digital filters and operating to generate a series of blocks of transform terms $[A_K]_{K=0}^{N-1}$ from a series of blocks of N digital samples $[a_n]_{n=0}^{N-1}$, where N is a square of an integer, said generator being of the type having an upstream weighting means for providing weighted sample $a_n$ terms and a downstream weighting means for providing transformed terms $A_K$ and having a bank of filters placed between said weighting means, the outputs of which are added together, by an adding means, said adding means being provided for adding the filtered outputs of individual orders of said bank of filters, wherein said improvement comprises:

(a) an input means for subtracting, term-by-term, the weighted $a_n$ term which belongs to a preceding block of samples from the corresponding $a_n$ term provided by said input weighting means, and (b) each of the filters of said bank includes
a recursive filtering means having an input and an output, its input being connected to the output of said input subtracting means, and
a recirculation means having an input and an output, and
a switching means connected between the output of said recursive filtering means and the input of said recirculation means, and
a multiplying means connected to the output of said recirculating means for weighting the output terms of said recirculation means; and
the output of said multiplying means being connected to said adder means for adding the filtered outputs of said individual ones of said filters in said bank together, the output of said adder means being connected to said downstream weighting means, the output of which provides terms $A_K$ of the transform operation.

5. A digital filtering device for a signal defined by its digitally represented samples $a_n$, said device being of the type having a means operating according to the "overlap-add" process comprising
means for splitting the stream of samples of the signal to be filtered into sample blocks of a fixed length;
a first weighting means having an input and an output;
an input terminal receiving said samples and connected to the input of said first weighting means;
a delaying means connected to the output of said first weighting means for delaying the terms issued from said weighting means by a time period equal to one-half the length of one block of signals;
a first adding means connected to the outputs of said first weighting means and said delaying means for adding corresponding delayed and undelayed weighted terms in successive blocks;
a first subtracting means also connected to the outputs of said first weighting means and said delaying means to subtract said delayed terms from the corresponding undelayed term in a succeeding block;
a first filter bank, each branch of which includes:
a recursive filtering means of the first order;
a recirculation means;
a switching means connected between said recursive filtering means and said recirculation means; and
a second weighting means for weighting the output of said recirculation means;
means for connecting the input of the filter branches of odd order to the output of said first subtracting means;
another means connecting the input of the filter branches of the even order to the output of said first adding means;
a second and a third adding means for adding together the outputs of the second weighting means of the filter branches of the odd order and of the even order, respectively;
a fourth adding means connected to the outputs of said second and third adding means for adding the output terms thereof;
a second subtracting means also connected to the outputs of said second and third adding means, for subtracting the output of said third adding means from the output of said second adding means;
a memory storing weighted transforms of a number of filter constants;
a multiplier means having an input and an output;
means for connecting the output of said second subtracting means and the output of said fourth adding means to the first input of said multiplier, the second input of said multiplier connected to receive the terms provided by said memory; and
a duplicate transform structure connected to the output of said multiplier to perform an inverse transform operation on the output terms of said multiplier, said duplicate structure comprising:
a second delaying means, a fifth adding means, and a third subtracting means connected to the output of said multiplier to respectively add and subtract delayed terms from said multiplier from the output terms of said multiplier;
another filter bank as defined for said first filter bank to provide successive output terms of said inverse operation on the output terms of said fifth adding means and said third subtracting means; and
an output weighting means to multiply the output terms of said another filter bank by a weighting factor to provide samples of a signal representing a filtered input signal.

* * * * *